(12) United States Patent
Haba

(10) Patent No.: US 7,767,497 B2
(45) Date of Patent: Aug. 3, 2010

(54) MICROELECTRONIC PACKAGE ELEMENT AND METHOD OF FABRICATING THEREOF

(75) Inventor: Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 413 days.

(21) Appl. No.: 11/827,676

(22) Filed: Jul. 12, 2007

(65) Prior Publication Data

US 2009/0014861 A1    Jan. 15, 2009

(51) Int. Cl.
*H01L 21/44* (2006.01)
*H01L 21/48* (2006.01)

(52) U.S. Cl. .............. 438/122; 438/121; 438/123; 438/118; 257/E21.506

(58) Field of Classification Search ......... 438/121–123, 438/118, E21.506; 257/E21.506
See application file for complete search history.

(56) References Cited

U.S. PATENT DOCUMENTS

| | | | |
|---|---|---|---|
| 5,607,818 A | 3/1997 | Akram et al. | |
| 5,895,967 A | 4/1999 | Stearns et al. | |
| 5,896,271 A * | 4/1999 | Jensen et al. | 361/719 |
| 6,025,650 A * | 2/2000 | Tsuji et al. | 257/786 |
| 6,083,837 A * | 7/2000 | Millet | 438/691 |
| 6,350,668 B1 | 2/2002 | Chakravorty | |
| 6,373,273 B2 | 4/2002 | Akram et al. | |
| 6,426,642 B1 | 7/2002 | Akram et al. | |
| 6,512,552 B1 * | 1/2003 | Subramanian | 348/564 |
| 6,528,874 B1 | 3/2003 | Iijima et al. | |
| 6,562,660 B1 * | 5/2003 | Sakamoto et al. | 438/124 |
| 6,617,236 B2 | 9/2003 | Oosawa et al. | |
| 6,646,337 B2 | 11/2003 | Iijima et al. | |
| 6,753,600 B1 | 6/2004 | Ho | |
| 6,782,610 B1 | 8/2004 | Iijima et al. | |
| 6,828,221 B2 | 12/2004 | Iijima et al. | |
| 6,855,577 B2 * | 2/2005 | Azuma | 438/118 |
| 6,884,709 B2 | 4/2005 | Iijima et al. | |
| 6,891,273 B2 | 5/2005 | Pu et al. | |
| 2001/0019852 A1 * | 9/2001 | Hashimoto | 438/106 |
| 2004/0183167 A1 | 9/2004 | Hortaleza et al. | |
| 2004/0238934 A1 * | 12/2004 | Warner et al. | 257/686 |
| 2005/0116326 A1 | 6/2005 | Haba et al. | |
| 2005/0181544 A1 | 8/2005 | Haba et al. | |
| 2006/0205117 A1 * | 9/2006 | Grigg et al. | 438/118 |

OTHER PUBLICATIONS

International Search Report, PCT/US2008/008134.

* cited by examiner

*Primary Examiner*—Nitin Parekh
(74) *Attorney, Agent, or Firm*—Lerner, David, Littenberg, Krumholz & Mentlik, LLP

(57) ABSTRACT

Microelectronic package elements and packages having dielectric layers and methods of fabricating such elements packages are disclosed. The elements and packages may advantageously be used in microelectronic assemblies having high routing density.

20 Claims, 11 Drawing Sheets

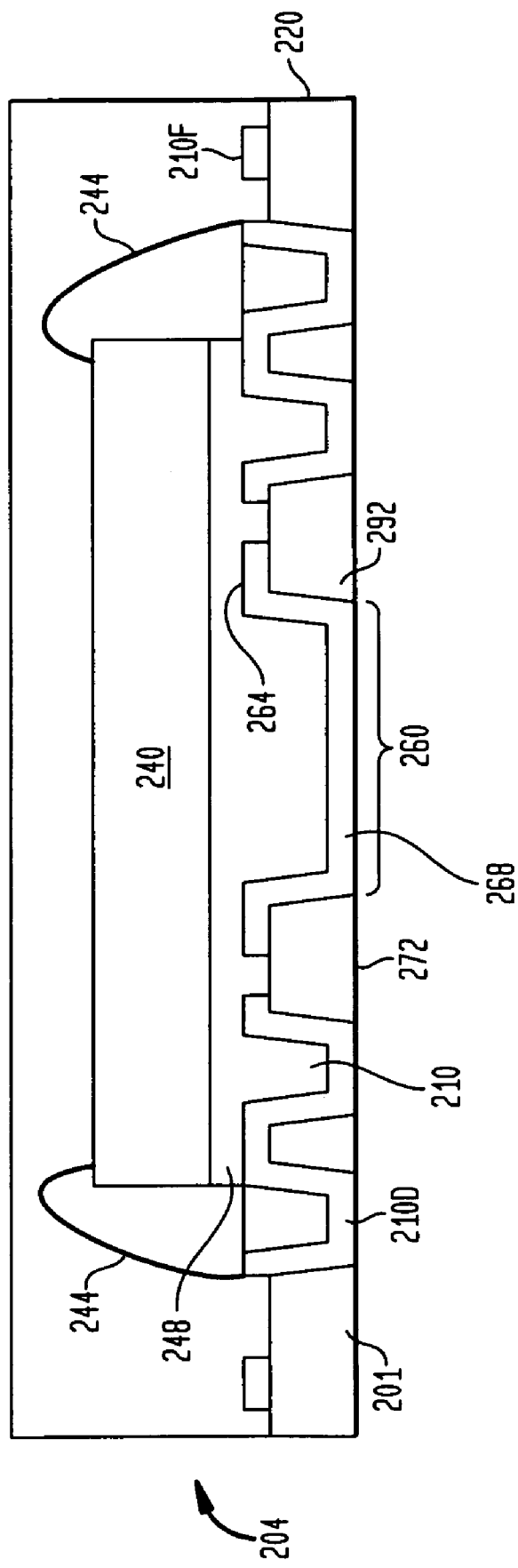

MICROELECTRONIC PACKAGE ELEMENT AND METHOD OF FABRICATING THEREOF

FIELD OF THE INVENTION

The present invention generally relates to microelectronic packages and, in particular, to methods of packaging microelectronic elements and methods of making packaging elements used in microelectronic packages.

BACKGROUND OF THE INVENTION

Microelectronic packages or packaging elements such as substrates are widely used in electronic assemblies. Typical packages and packaging elements commonly include a dielectric material in the form of a sheet or plate of dielectric material having numerous conductive traces extending on a sheet or plate. The traces may be provided in one layer or in multiple layers, separated by layers of dielectric material. The packages or packaging elements may also include conductive elements such as via liners extending through the layers of dielectric material to interconnect traces in different layers. In some cases circuit panels are used as elements of microelectronic packages.

Microelectronic packages generally comprise one or more substrates with one or more microelectronic devices such as one or more semiconductor chips mounted on such substrates. The conductive elements of the substrate may include the conductive traces and terminals for making electrical connection with a larger substrate or circuit panel, thus facilitating electrical connections needed to achieve desired functionality of the devices. The chip may be electrically connected to the traces and hence to the terminals, so that the package can be mounted to a larger circuit panel by bonding the terminals to contact pads on the larger circuit panel. For example, some substrates used in microelectronic packaging have terminals in the form of pins or contacts extending from the dielectric element.

Despite considerable efforts devoted in the art heretofore to development of microelectronic packages and packaging elements and methods for fabricating such devices, further improvement would be desirable.

SUMMARY OF THE INVENTION

One aspect of the invention is a method making a package element. A package element may have a top face and a bottom face remote from the top face. The package element may be formed by deforming a metal sheet to form a plurality of hollow contacts. The hollow contacts may include upwardly-facing first contacts exposed at the top face, and a plurality of downwardly-facing second contacts exposed at the bottom face which may be connected to the first contacts. Some of the first and second contacts may be electrically isolated from others of the first and second contacts. A dielectric material may be applied into spaces between some or all of the first and second contacts. Some of the first contacts may be exposed at the top face and some of the second contacts may be exposed at the bottom face.

Another aspect of the invention is a method of packaging a microelectronic element. The microelectronic element may be packaged by forming a package element. The package element may have a top face and a bottom face remote from the top face. The package element may be formed by deforming a metal sheet to form a plurality of hollow contacts. The hollow contacts may include upwardly-facing first contacts exposed at the top face, and a plurality of downwardly-facing second contacts exposed at the bottom face and which may be connected to the first contacts. Some of the first and second contacts may be electrically isolated from others of the first and second contacts. A dielectric material may be applied into spaces between some or all of the first and second contacts. Some of the first contacts may be exposed at the top face and some of the second contacts may be exposed at the bottom face. A microelectronic element may be mounted to the top face of the package element and may electrically interconnect the microelectronic element to at least one of the first contacts or the second contacts.

In another aspect of the invention, a package element has a top face and a bottom face remote from the top face. The package element may include a deformed metal sheet having a plurality of hollow contacts. The hollow contacts may include upwardly-facing first contacts, and a plurality of downwardly-facing second contacts which may be connected to the first contacts. Some of the first and second contacts may be electrically isolated from others of the first and second contacts. A dielectric material may be disposed into spaces between some or all of the first and second contacts. Some of the first contacts may be exposed at the top face and some of the second contacts may be exposed at the bottom face.

In yet another aspect of the invention, a packaged microelectronic element comprises a package element. The package element has a top face and a bottom face remote from the top face. The package element may include a deformed metal sheet having a plurality of hollow contacts. The hollow contacts may include upwardly-facing first contacts, and a plurality of downwardly-facing second contacts which may be connected to the first contacts. Some of the first and second contacts may be electrically isolated from others of the first and second contacts. A dielectric material may be disposed into spaces between some or all of the first and second contacts. Some of the first contacts may be exposed at the top face and some of the second contacts may be exposed at the bottom face. A microelectronic element may be mounted to the top face of the package element and may be electrically interconnected to at least one of the first contacts or the second contacts.

The Summary is not intended nor should it be construed as being representative of the full extent and scope of the present invention, which additional aspects will become more readily apparent from the detailed description, particularly when taken together with the appended drawings.

BRIEF DESCRIPTION OF THE DRAWINGS

FIGS. 7A-7D are schematic, cross-sectional views of portions a microelectronic package fabricated according to further embodiments of the invention.

Herein, identical reference numerals are used, where possible, to designate identical elements that are common to the figures. The images in the drawings are simplified for illustrative purposes and are not depicted to scale.

The appended drawings illustrate exemplary embodiments of the invention and, as such, should not be considered as limiting the scope of the invention that may admit to other equally effective embodiments.

DETAILED DESCRIPTION

Figure 1:
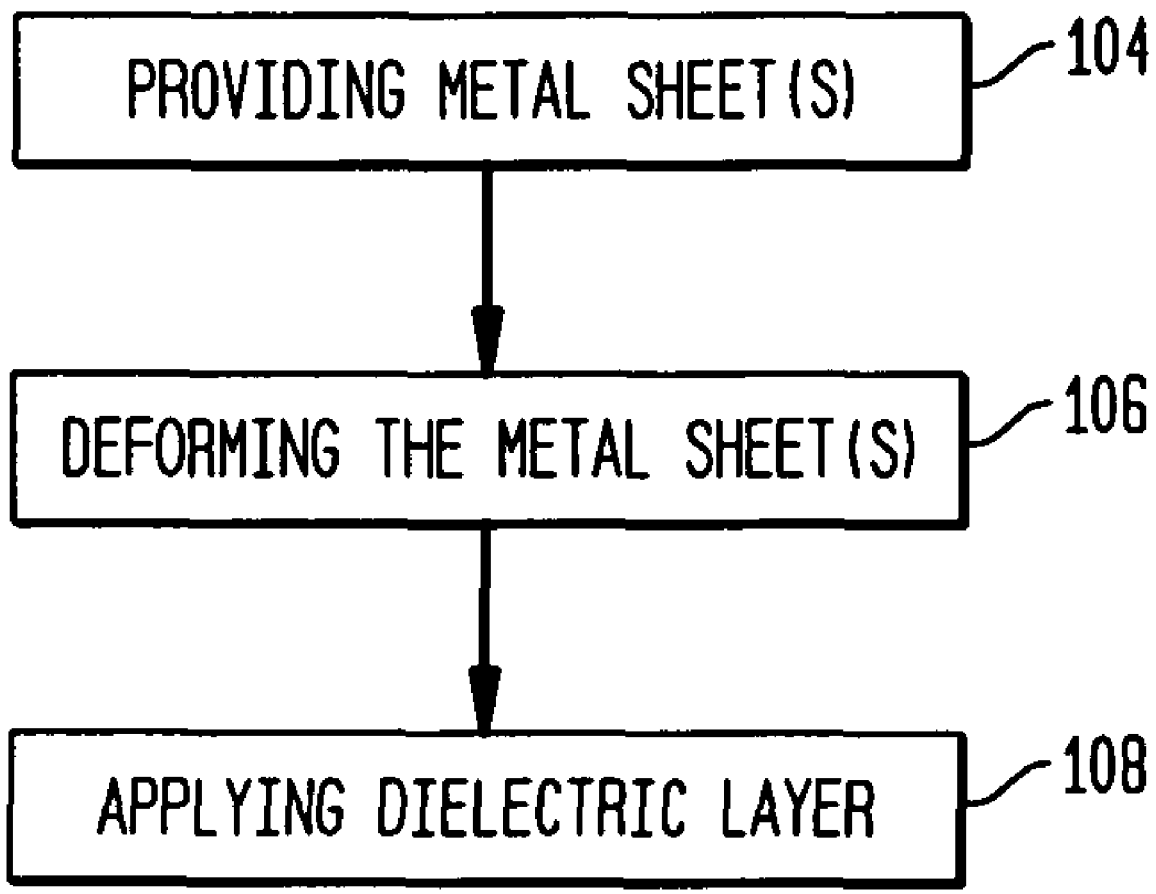
FIG. 1 is a flow diagram illustrating a method in accordance with one embodiment of the present invention.

FIG. 1 depicts a flow diagram illustrating a method 100 of fabricating a package element in accordance with one embodiment of the present invention. The method 100 includes processing steps performed during packaging of the microelectronic element. In some embodiments, these processing steps are performed in the depicted order. In alternate embodiments, at least two of these steps may be performed contemporaneously or in a different order. Although not shown in FIG. 1., sub-steps and auxiliary procedures (e.g., transfers between processing reactors, cleaning sub-steps, process control sub-steps, and the like) such as may be performed in packaging processes, can be performed between the steps depicted in FIG. 1. Cross-sectional views in the drawings are arbitrarily taken along a centerline 1-1 (shown in FIG. 2A only) of a metal sheet of a microelectronic package fabricated using the method 100.

Figure 2A:
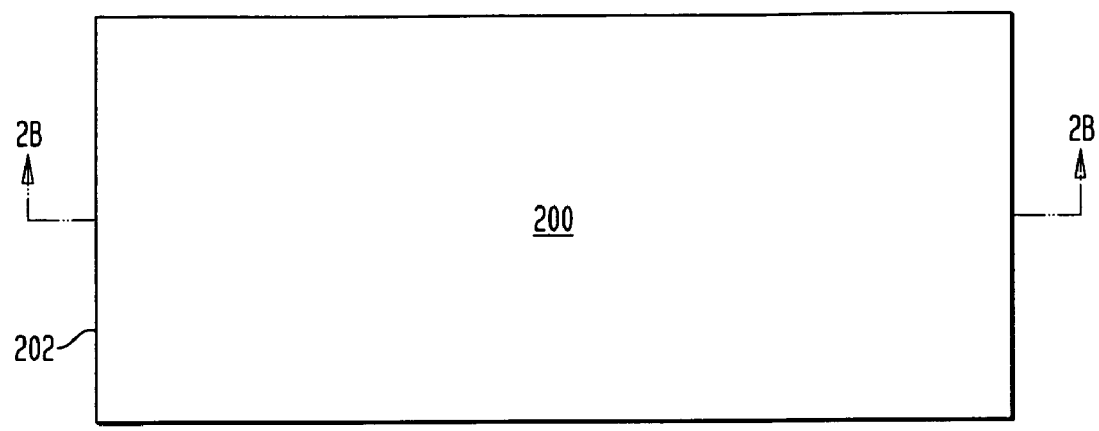
FIGS. 2A-2D are plan (FIG. 2A, 2D), and cross-sectional views (FIGS. 2B, 2C) of portions of a metal sheet during fabrication stages of the method of FIG. 1.
Figure 2B:

In step 104 of a method according to one embodiment of the invention an electrically conductive metal sheet 200 is provided. Metal sheet 200 has a perimeter 202 (FIGS. 2A-2B). Desirably, the sheet 200 consists essentially of metal. A thickness 204 of the sheet 200 is generally selected in range from about 5 to 75 μm. The metal sheet may consist essentially of copper and may also include copper alloys such as alloys of copper and zinc, copper and tin, copper and aluminum, copper and silicon, copper and nickel and/or silver and including but not limited to brasses, phosphor bronzes, aluminum bronzes, and silicon bronzes. Metal sheets consisting of essentially of aluminum or aluminum alloys may also be employed.

Figure 2C:
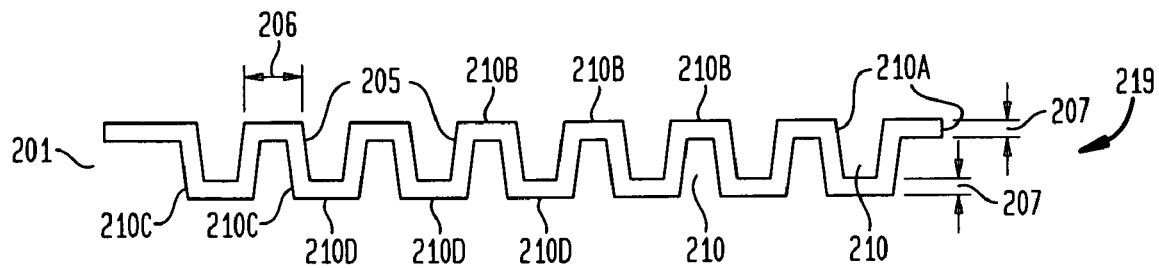
Figure 2D:
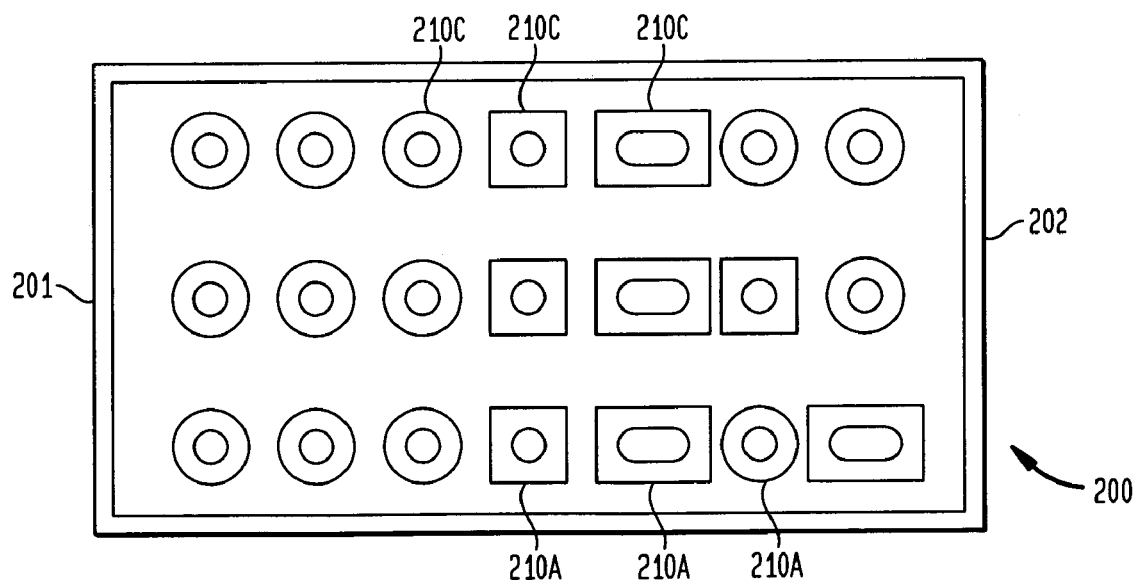

At step 106, a plurality of hollow contacts 210 are formed by deforming sheet 200 (FIG. 2C). Upwardly-facing first contacts 210A are formed which are exposed at top face 210B. A plurality of downwardly-facing second contacts 210C are exposed at the bottom face 210D. The first contacts 210A and second contacts 210C are connected by metallic walls 205 which result from the deforming process. Widths of the contacts 210 as indicated by arrow 206 are generally selected in a range from about 100 to 1000 μm, for example, 200-300 μm. Contacts 210A, 210C may be substantially uniform in thickness as indicated by arrows 207. An exemplary placement of contacts 210A and 201C is illustrated in the plan view of FIG. 2D.

Figure 3A:
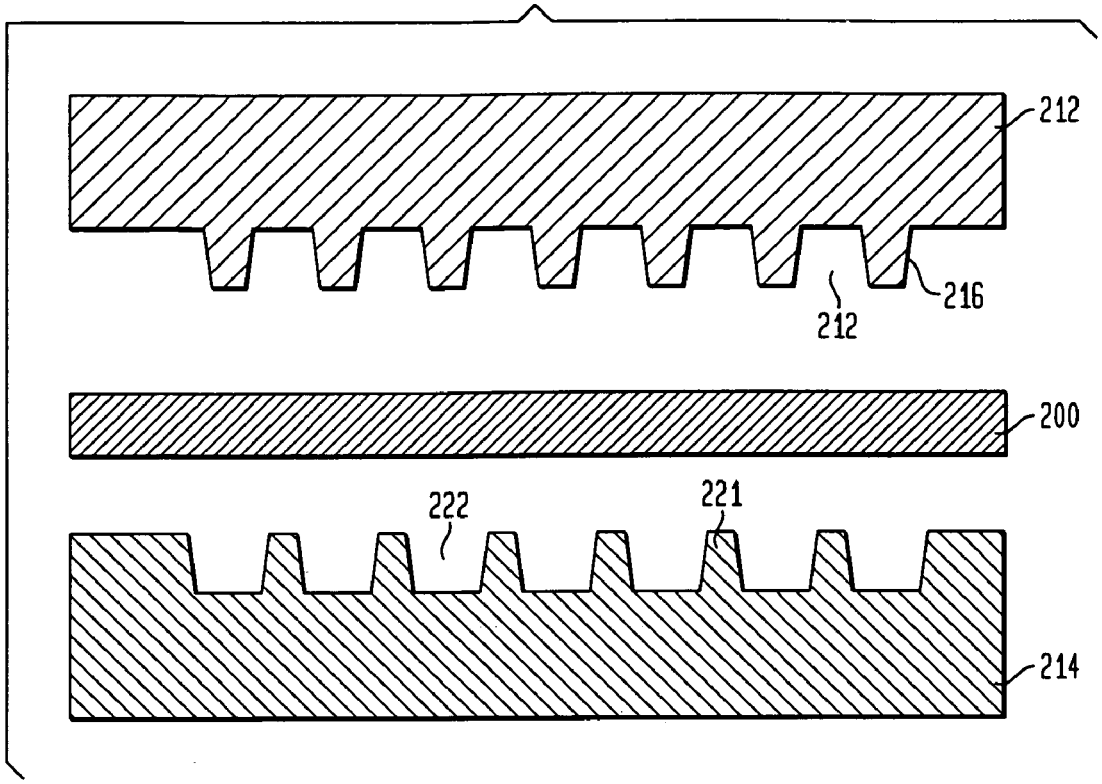
FIGS. 3A-3B are schematic, cross-sectional views of portions of a microelectronic element fabricated during successive stages of a method according to an embodiment of the invention.
Figure 3B:
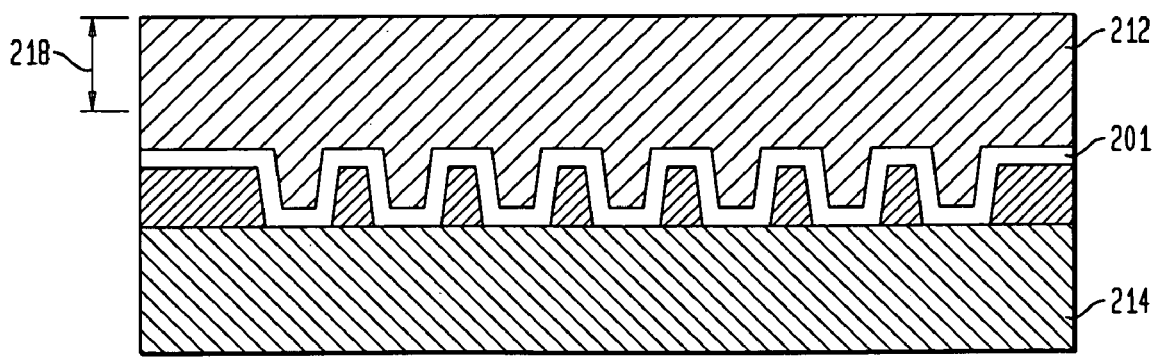

At step 106, contacts 210 are formed by deforming sheet 200 using a stamping operation. The stamping operation may include application of heat and/or pressure to sheet 200 which, optionally, is pressed between first die 212 and second die 214, to as shown in FIGS. 3A and 3B, to create the deformed metal sheet 201. Multiple dies may be used to deform the sheet 200 to form hollow contacts 210.

First die 212 is a male die having projections 216 and recesses 218 and second die 214 is a female die having complementary projections 221 and recesses 222 to form hollow contacts 210. Dies 212, 214 are secured to a press (not shown), such as a hydraulic metal stamping press as available for use in various processes.

Die 212 moves upwardly and downwardly in the direction of arrow 218 (FIG. 3B) thus deforming metal sheet 200 to form a plurality of hollow contacts 210. The metal sheet 200 may be deformed to a final configuration 201 in one or more strokes of the press. Stamping parameters required to obtain optimum shaping of element 201, such as a substantially uniform wall thickness and minimum scrap rate are known to those skilled in the art.

It will also be appreciated that the stamping process disclosed may be utilized to form one packaging element, or a plurality of packaging elements simultaneously depending on, among other factors, the size of metal sheet 200, the size of the dies, the capacity of the stamping equipment, the manufacturing demand and the economies of scale.

The contacts 210 are formed at locations facilitating connectivity between elements of an electrical circuit of the microelectronic element being fabricated. Such contacts may have different form factors and be organized, for example, in one or more grid-like patterns having a pitch in a range from 100 to 10000 μm.

Figure 4A:
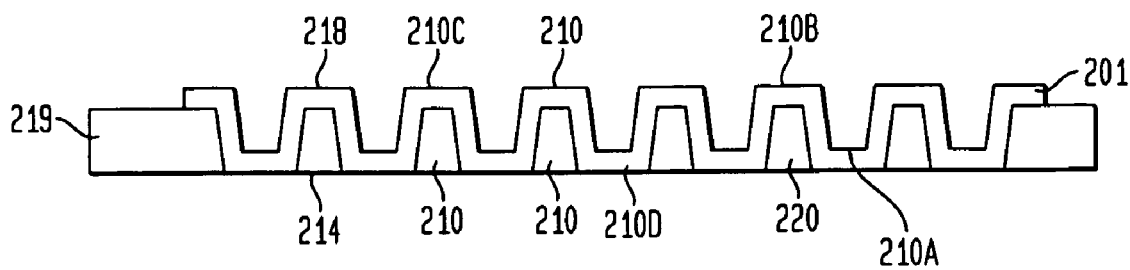
FIGS. 4A-4C are schematic, cross-sectional and plan (FIG. 4C) views of portions of a microelectronic element fabricated during successive stages of a method according to an embodiment of the invention.
Figure 4B:
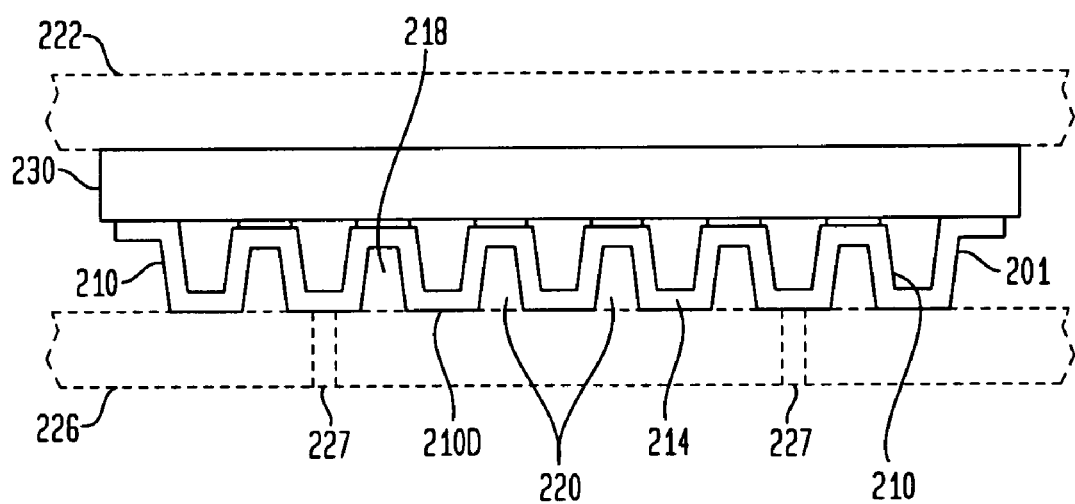

In the next stage of the method, at step 108, a dielectric layer 220 is applied to the element 201 (FIGS. 4A-4B). A flowable composition is introduced between the contacts 210 to form the dielectric layer. The composition can include various dielectric or dielectric forming materials such as, without limitation, thermoplastic and thermoset materials, epoxies, liquid crystal polymers (LCP's) and polyimides. The selection of dielectric material will depend on the application process and the dielectric requirements of a particular application.

For example, compositions which cure by chemical reaction to form a polymeric dielectric, such as epoxies and polyimides may be used. In other cases, the flowable composition may be one which becomes flowable at elevated temperature, and which can be set to a solid condition by cooling.

The dielectric layer 220 may form binding interfaces with features of the deformed sheet 201. The dielectric material may further include one or more additives that influence the properties of the dielectric layer 220. For example, such additives may include particulate materials such as silica or other inorganic dielectrics, or fibrous reinforcements such as short glass fibers to increase strength, adhesion, and/or dielectric properties of the material.

The dielectric material may be applied using an injection molding process. During the injection molding processes, the deformed metal sheet 201 is sandwiched between a press plate 222, a counter element 226 (shown using phantom lines), and a molding tool 230 (FIG. 4B). The counter element 226 is abutted against the bottom face 210D of the contacts 210 and the flowable composition is injected or otherwise provided or introduced into the space between the deformed metal sheet 200 and counter element 226.

In the particular embodiment depicted in FIG. 4B, the dielectric material is injected through at least one opening, or gate, 227 in the counter element 226 (as shown). Subsequently, the press plate 222, the counter element 226 and the molding tool 230 are removed (FIG. 4A). Ordinarily, the faces 210D, 210B of the contacts 210 are free of molding composition at the completion of the molding step. In some instances, a thin film of molding composition may overlie the bottom or top surfaces 210D, 210B of some or all of the contacts. If this occurs, the thin film can be removed by exposing the surfaces of the molded dielectric layer to a brief plasma etching or ashing process which attacks the molded dielectric and thus provides clean, dielectric free contact surfaces.

Figure 4C:
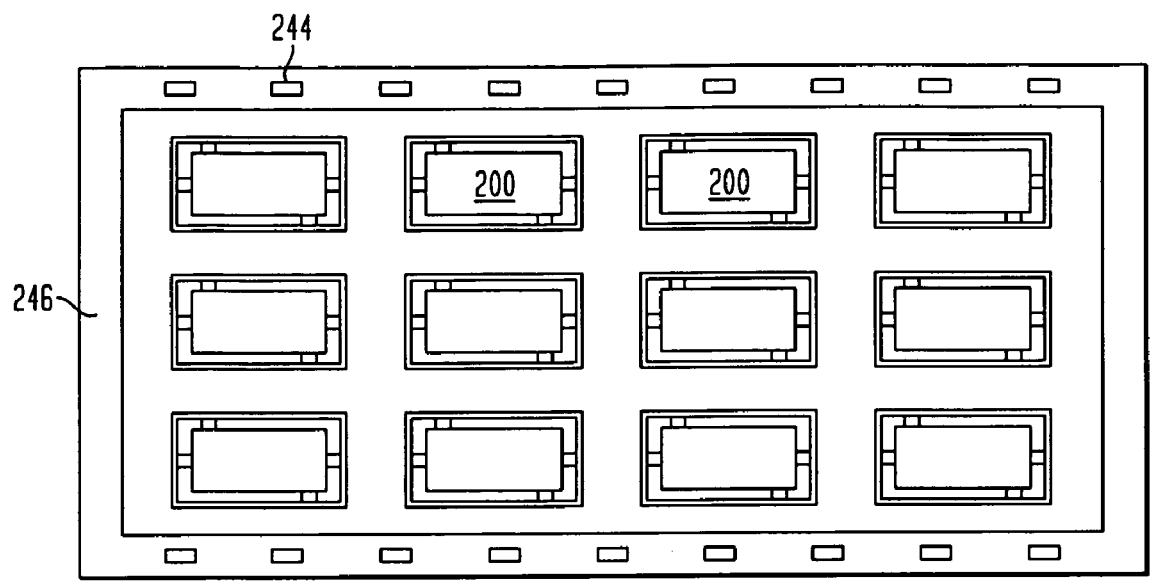

As depicted in FIG. 4C the metal sheet 200 may be a portion of a larger frame 246 incorporating a plurality of sheets 200. In this embodiment, the press plate and counter element of the molding tool are extended over the frame 246 and may be registered with the frame by a plurality of registration features 244. During the molding process, the molding composition is introduced into the spaces between the deformed sheets 201 and counter element through individual gates flowably coupled to a runner system of the molding tool (not shown). After the press plate and counter element are removed upon completion of the molding process, the deformed sheets 201 may be separated (e.g., cut out) from the frame. Such separation may also occur after step 110 as discussed below.

Figure 5:
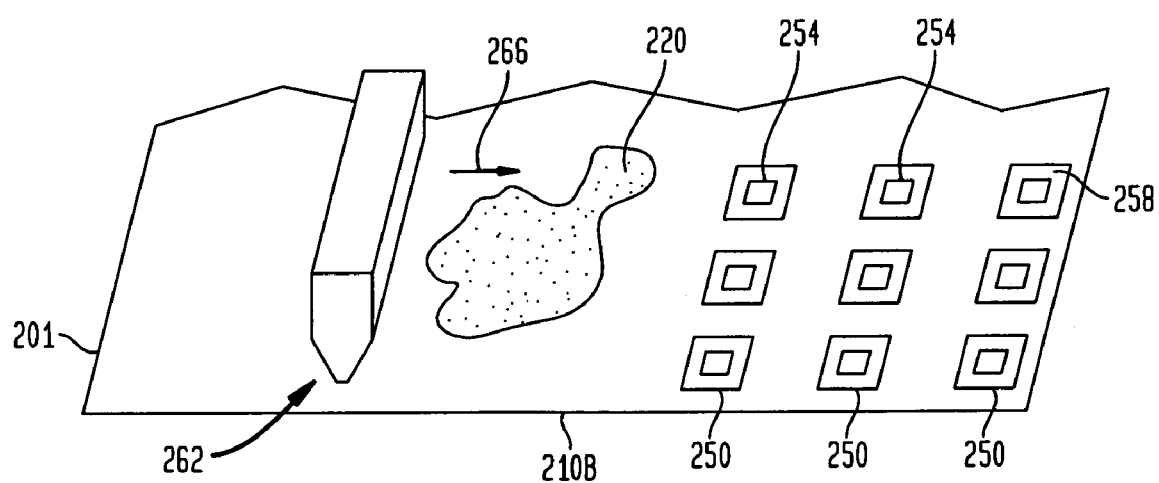
FIG. 5 is a schematic view of portions of a microelectronic element fabricated during successive stages of a method according to an embodiment of the invention.

Alternatively, the dielectric material 220 may be applied through a stencil or a screen by introducing a fluid dielectric material into spaces between the contacts 210 to form the dielectric layer 220. As depicted in FIG. 5, a stencil or mask material 250 having an open area 254 which material may flow through and a solid area 258 which prevents the flow of material which can be applied to one or both of the top face or bottom face of the deformed metal sheet 201. The stencil or mask may be fabricated by using conventional materials and well known photolithographic techniques. A flexible applicator such as squeegee 262 is drawn in the direction of arrow 266 to apply the dielectric material 220 into spaces between at least some of the first and second contacts as previously depicted in FIGS. 4A-B.

The dielectric material 220 may be applied manually or by using an automated process, by way of example, to control process parameters such as the application pressure, the amount and rate of dielectric material dispensed, the dwell time of the applicator, and the temperature of the process. In the case of screen or stencil printing, some dielectric materials may not need to be applied under pressure.

The application of dielectric material may be performed in one or more steps. A stencil may be used when it is desirable to mask off certain areas in order to prevent deposition of the dielectric material, likewise, a screen or mesh material may be used to flow a controlled amount of dielectric material into spaces between at least some of the first and second contacts in any desirable geometric pattern.

Other common methods may be employed for applying a dielectric material such as spin-forming a flowable dielectric material or laminating a dielectric sheet material into spaces between at least some of the first and second contacts as previously depicted in FIGS. 4A-B. Cleaning techniques as discussed above may be employed to remove excess dielectric materials from the contacts regardless of the application process used.

In accordance with the foregoing, a dielectric layer 219 has major surface 214 which may be optionally be coplanar with the exposed faces 210D of bottom contacts 210C (FIGS. 4A-B). The dielectric layer 219, also has top surface 218 which may optionally fill entire spaces below the top contacts 210C.

Figure 6A:
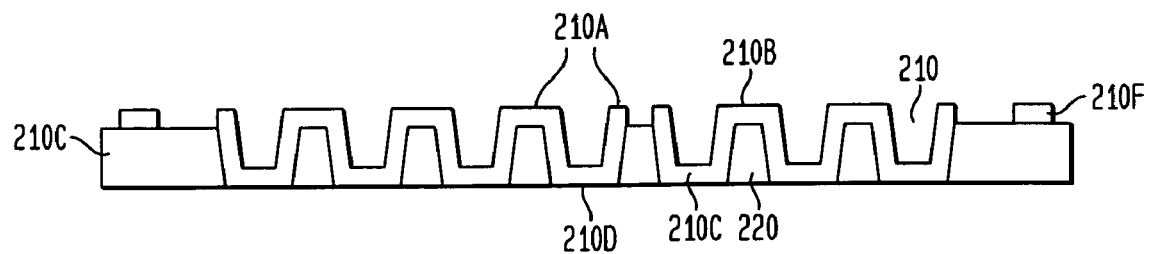
FIGS. 6A-6B are cross-sectional and plan views of portions of a microelectronic element fabricated during successive stages of a method according to an embodiment of the invention.
Figure 6B:
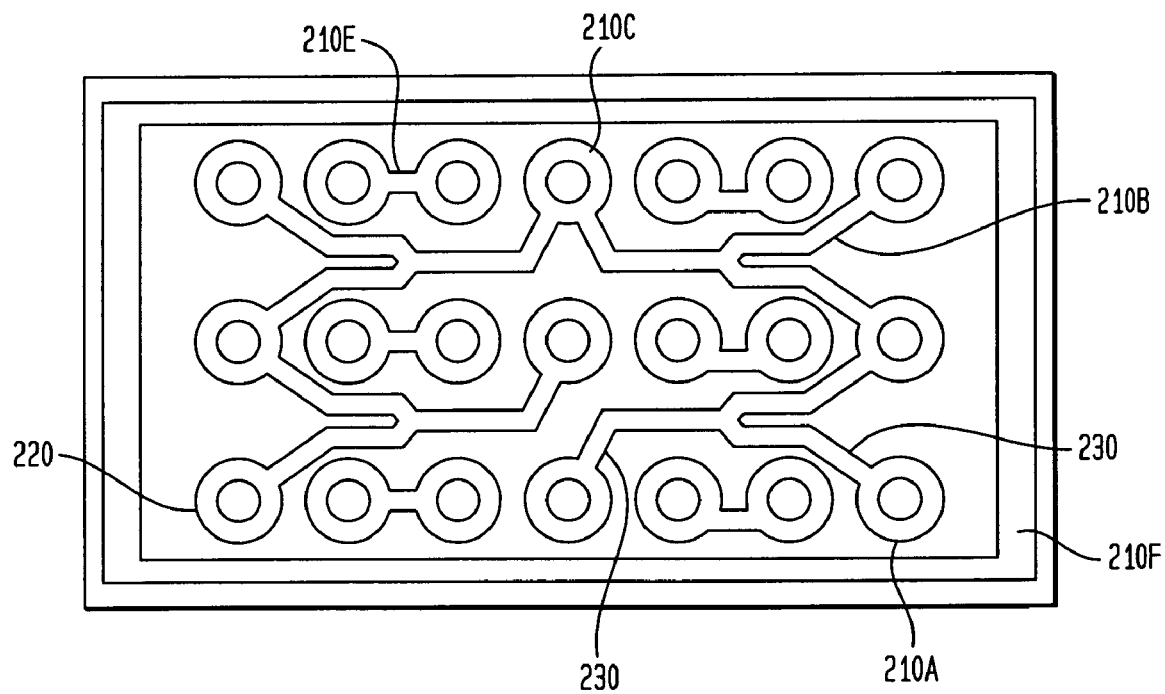

In step 110, traces may be defined in the metal sheet by photolithographically defining a mask layer overlying the deformed metal sheet 201 and etching the deformed metal sheet in accordance with the mask layer to electrically isolate first contacts 210A and second contacts 210C from others of the first and second contacts 210A, 210C as shown in FIGS. 6A-B. Any suitable metal removal technique or method may be utilized.

The contacts 210A, 201C are electrically connected together within a package element 202 (FIG. 6A). Each contact 210A, 210C may be connected to another contact. However, some contacts may "float," i.e., be electrically disconnected from other contacts.

As depicted in FIGS. 6A-B at least one contact 210F may be a peripheral contact having a closed-loop pattern and surrounding at least some of contacts as illustratively shown in FIGS. 6A-B. In the depicted embodiment, the peripheral contact 210F as a peripheral contact may further comprise contact areas 210E having smaller widths than other portions of the contact. In operation, the peripheral contact may reduce electromagnetic interference (EMI) between electrical circuits present on the same or adjacent devices.

Traces 230 may have different widths, including widths which are smaller or larger than the widths of the contacts 210, thus facilitating fabrication of a microelectronic package having high routing density. Generally, the widths of the traces 230 are selected in a range from about 5 to 100 μm (e.g., 20-40 μm), however, portions of traces or some traces may have widths greater than 100 μm.

Figure 7A:
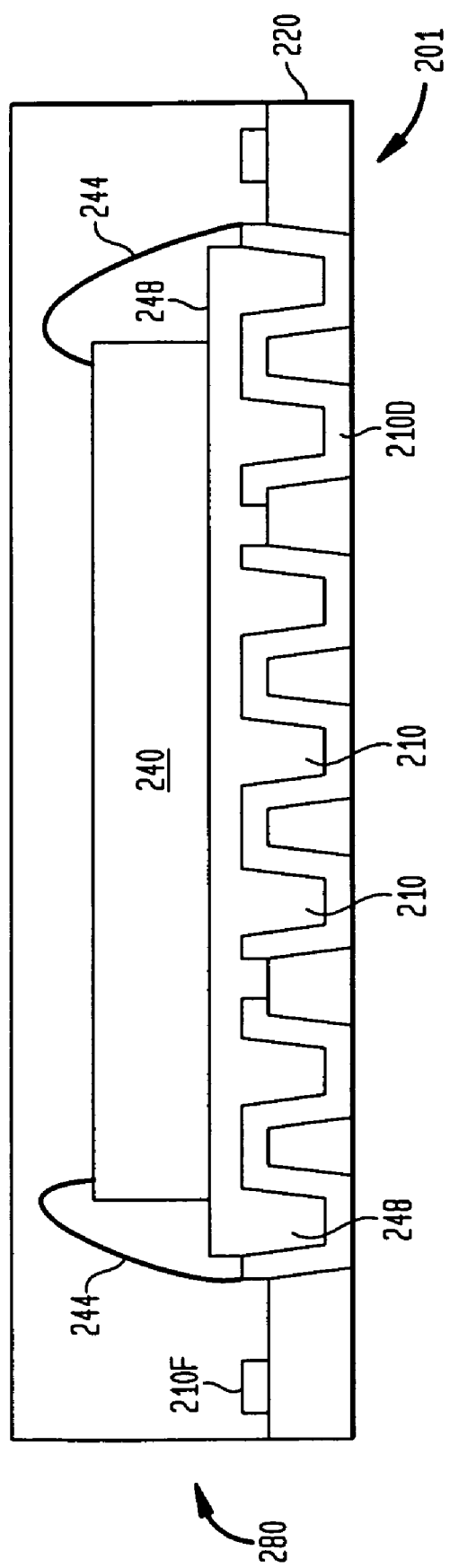

As depicted in FIG. 7A, a microelectronic element such as semiconductor chip 240 can be mounted to the package element 202 through an adhesive 248 and can be electrically connected by bond wires 244 to conductive contacts to form a package.

Alternatively, as shown in FIG. 7B, the package element 202 may include a thermal conductor 260 having top portions exposed at the top face 264, at least one bottom plane exposed at the bottom face 268 and walls 272 extending between the top and bottom portions. Such package element can be fabricated by a process substantially as discussed above.

The package element may include one or more thermal conductors in one or more regions of the deformed metal sheet 201. The thermal conductor may be used anywhere but is particularly useful to dissipate heat where high power and/or high-density components are mounted on a chip. This feature can help facilitate high-density packaging, packaging of high power-consuming chips, and/or increased reliability because of the enhanced ability to dissipate heat.

As discussed with reference to FIG. 7A, a microelectronic element such as semiconductor chip 240 is mounted to the package element 202 by adhesive 248, e.g. a die attach adhesive, which may be optionally disposed in hollow spaces overlying bottom contacts 210D and electrically connected by bond wires 244 to conductive contacts (not shown) of a chip. Standard wire bonding techniques may be used to connect contacts 210 to chip 240.

Figure 7C:
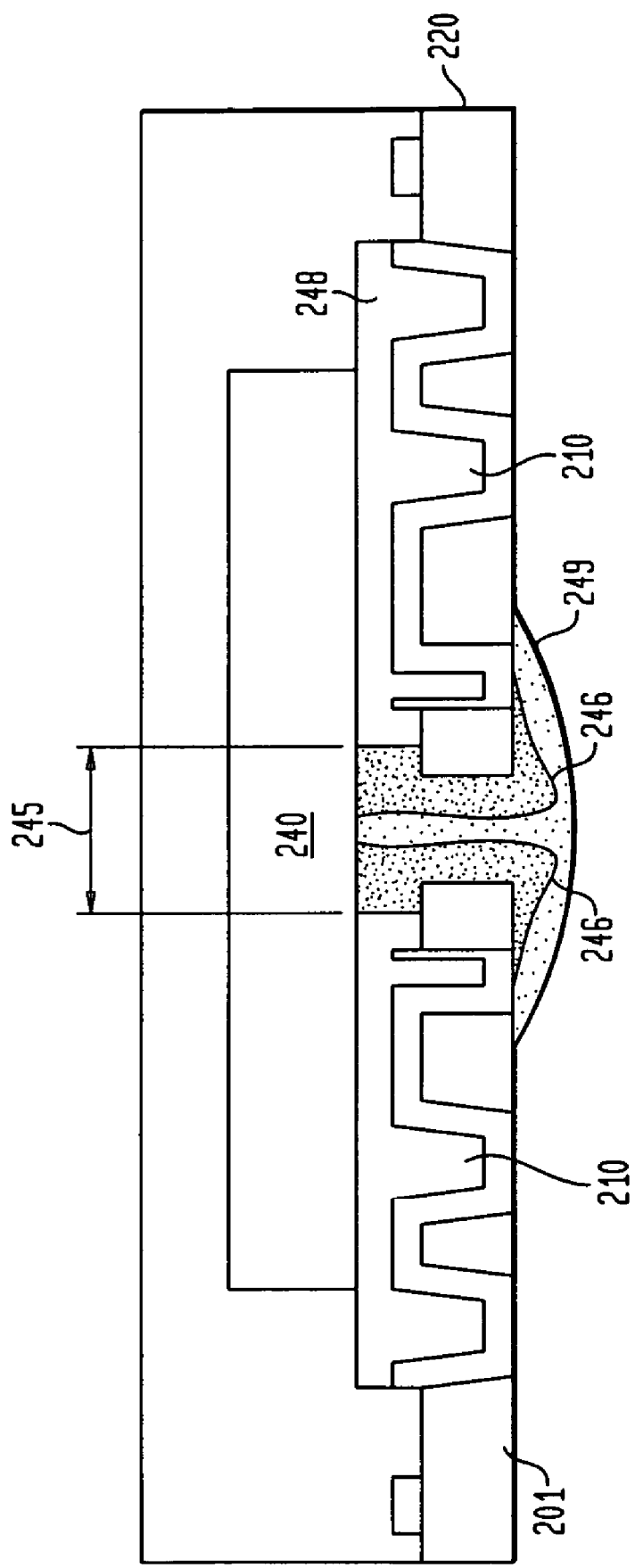

A microelectronic element 240 may be mounted and interconnected to the package element to form a packaged microelectronic element. As depicted in FIG. 7C, a microelectronic element 240 such as semiconductor chip is mounted to the package element 201 by adhesive 248 optionally disposed within hollow spaces 210 overlying the bottom contacts 210D and electrically connected by bond wires 246 to conductive contacts (not shown) of chip 240. In this embodiment, bond wires 246 connect a central region 245 of chip 240 by standard wire bonding methods to contacts 210C.

Figure 7D:
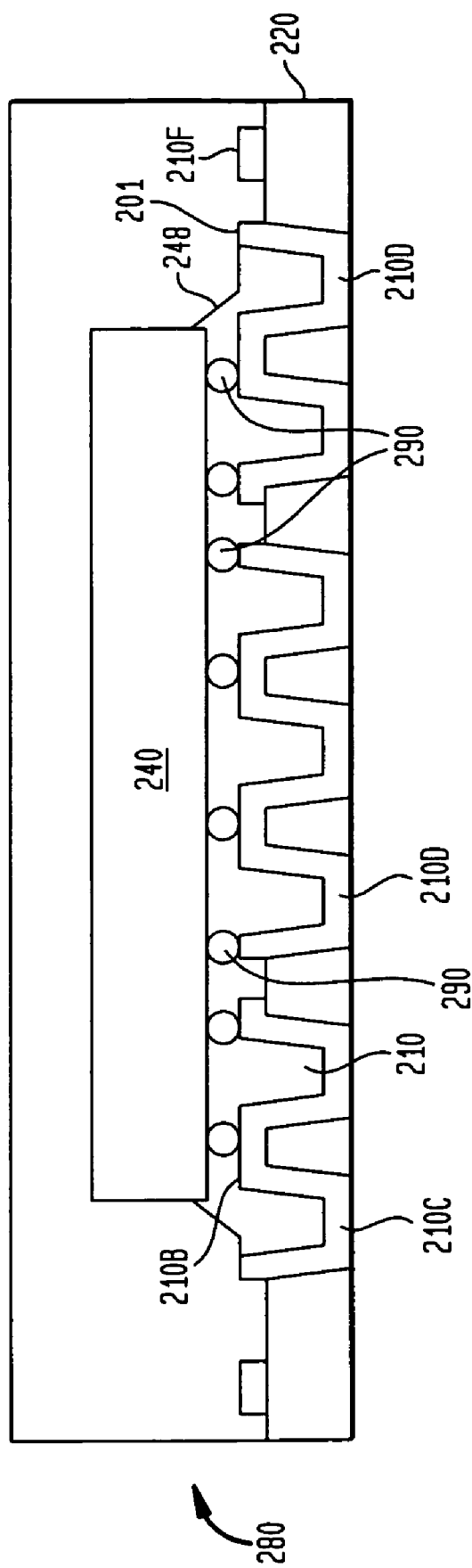

In an embodiment depicted in FIG. 7D, a microelectronic element such as semiconductor chip 240 is mounted to package element 202 by adhesive 248 optionally disposed within hollow spaces 210 above the bottom contacts 210D and electrically connected by solder balls 290 to conductive contacts (not shown) of chip 240. Standard ball bonding techniques well known in the industry may be used.

The assemblies discussed above may be interconnected to form multi-assembly packages comprise more than two assemblies, or assemblies of different types.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method making a package element having a top face and a bottom face remote from the top face, comprising the steps of:
   (i) deforming a metal sheet to form a plurality of hollow contacts, the hollow contacts including upwardly-facing first contacts exposed at the top face, and a plurality of downwardly-facing second contacts exposed at the bottom face connected to the first contacts, at least some of the first and second contacts being electrically isolated from others of the first and second contacts; and
   (ii) applying a dielectric material into spaces between at least some of the first and second contacts, the first contacts being exposed at the top face and the second contacts being exposed at the bottom face.

2. The method of claim 1 wherein step (i) includes stamping the metal sheet to form the plurality of hollow contacts.

3. The method of claim 1 wherein the metal sheet is deformed between a first die and a second die to form the plurality of hollow contacts.

4. The method of claim 1 wherein further including photolithographically defining a mask layer overlying the deformed metal sheet and etching the deformed metal sheet in accordance with the mask layer to electrically isolate the at least some first and second contacts from the others of the first and second contacts.

5. The method of claim 1 wherein the dielectric material is applied by flowing through at least one of a stencil or a screen.

6. The method of claim 1 wherein the dielectric material is applied with a spin-on process.

7. The method of claim 1 wherein the dielectric material is applied with an injection molding process.

8. The method of claim 1 wherein the dielectric material is applied by a laminating a dielectric sheet onto at least one of the top face or bottom face.

9. The method of claim 1 wherein the metal sheet consists essentially of copper.

10. The method of claim 1 wherein the dielectric material includes epoxy.

11. A method of packaging a microelectronic element, comprising the steps of:
   (a) forming a package element having a top face and a bottom face remote from the top face, the package element being formed by (i) deforming a metal sheet to form a plurality of hollow contacts, the hollow contacts including upwardly-facing first contacts exposed at the top face, and a plurality of downwardly-facing second contacts exposed at the bottom face connected to the first contacts, at least some of the first and second contacts being electrically isolated from others of the first and second contacts; and (ii) applying a dielectric material into spaces between at least some of the first and second contacts, the first contacts being exposed at the top face and the second contacts being exposed at the bottom face, and
   (b) mounting a microelectronic element to the top face of the package element and electrically interconnecting the microelectronic element to at least one of the first contacts or the second contacts.

12. The method of claim 11 wherein step (a) includes stamping the metal sheet to form the plurality of hollow contacts.

13. The method of claim 11 wherein step (a) includes deforming the metal sheet between a first die and a second die to form the plurality of hollow contacts.

14. The method of claim 11, wherein step (a) further includes photolithographically defining a mask layer overlying the deformed metal sheet and etching the deformed metal sheet in accordance with the mask layer to electrically isolate the at least some first and second contacts from the others of the first and second contacts.

15. The method of claim 11 wherein the dielectric material is applied by flowing a fluid dielectric through at least one of a stencil or a screen.

16. The method of claim 11 wherein the dielectric material is applied with a spin-on process.

17. The method of claim 11 wherein the dielectric material is applied with an injection molding process.

18. The method of claim 11 wherein the dielectric material is applied by laminating dielectric sheet material onto at least one of the top face or bottom face.

19. The method of claim 11 wherein the metal sheet consists essentially of copper.

20. The method of claim 11 wherein the dielectric material includes epoxy.

* * * * *

UNITED STATES PATENT AND TRADEMARK OFFICE
CERTIFICATE OF CORRECTION

| | | |
|---|---|---|
| PATENT NO. | : 7,767,497 B2 | Page 1 of 1 |
| APPLICATION NO. | : 11/827676 | |
| DATED | : August 3, 2010 | |
| INVENTOR(S) | : Belgacem Haba et al. | |

It is certified that error appears in the above-identified patent and that said Letters Patent is hereby corrected as shown below:

Column 1, line 46 before "making" insert --of--.
Column 3, line 6 before "a" insert --of--.
Column 3, line 40 before "range" insert --a--.
Column 3, line 46 before "essentially" delete "of".
Column 3, line 65 before "as" delete "to".
Column 4, line 13 after "rate" insert --,--.
Column 5, line 58 before "optionally" delete "be".
Column 5, line 60 after "219" delete ",".
Column 6, line 11 after "of" insert --the--.
Column 7, line 1 "ball bonding" should read --ball-bonding--.
Column 7, line 4 "comprise" should read --comprising--.
Column 7, line 15 after "method" insert --of--.
Column 7, line 34 before "further" delete "wherein".
Column 7, line 47 after "by" delete "a".

Signed and Sealed this
Twenty-third Day of August, 2011

David J. Kappos
*Director of the United States Patent and Trademark Office*